(12) United States Patent
Tsubaki

(10) Patent No.: US 7,253,478 B2
(45) Date of Patent: Aug. 7, 2007

(54) SEMICONDUCTOR DEVICE

(75) Inventor: Shigeki Tsubaki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/145,939

(22) Filed: Jun. 7, 2005

(65) Prior Publication Data

US 2005/0269601 A1    Dec. 8, 2005

(30) Foreign Application Priority Data

Jun. 8, 2004    (JP)    ............... 2004-170536

(51) Int. Cl.
   *H01L 29/76*    (2006.01)
(52) U.S. Cl. .............. 257/344; 257/E21.435
(58) Field of Classification Search ......... 257/335, 257/343, 344, E21.435
   See application file for complete search history.

(56) References Cited

U.S. PATENT DOCUMENTS

| | | | | |
|---|---|---|---|---|
| 5,637,889 | A * | 6/1997 | Groover et al. ............ | 257/192 |
| 6,552,390 | B2 * | 4/2003 | Kameda ..................... | 257/335 |
| 6,614,077 | B2 * | 9/2003 | Nakamura et al. .......... | 257/355 |
| 6,768,173 | B2 * | 7/2004 | Hebert ........................ | 257/345 |
| 2002/0084489 | A1 * | 7/2002 | Yamamoto ................. | 257/351 |

FOREIGN PATENT DOCUMENTS

| | | |
|---|---|---|
| JP | 2002-343960 | 11/2002 |
| JP | 2004-63922 | 2/2004 |

OTHER PUBLICATIONS

Wolf S. "Silicon Processing for the VLSI Era", Lattice Press, vol. 2, p. 318.*

* cited by examiner

*Primary Examiner*—B. William Baumeister
*Assistant Examiner*—Amar Movva
(74) *Attorney, Agent, or Firm*—McGinn IP Law Group, PLLC

(57) ABSTRACT

The semiconductor device comprises: a semiconductor substrate (N⁺ substrate 110) containing a first conductivity type impurity implanted therein; a second conductivity type impurity-implanted layer (P⁺ implanted layer 114) at relatively high concentration, formed on the semiconductor substrate (N⁺ substrate 110); a second conductivity type impurity epitaxial layer (P⁻ epitaxial layer 111) at relatively low concentration, formed on the second conductivity type impurity-implanted layer (P⁺ implanted layer 114); and a field effect transistor 100 (N-channel type lateral MOSFET 100) composed of a pair of impurity diffusion regions (N⁺ source diffusion layer 115 and N⁻ drain layer 116) provided in the second conductivity type impurity epitaxial layer (P⁻ epitaxial layer 111) and a gate electrode 117 provided over a region sandwiched with the pair of impurity diffusion regions (N⁺ source diffusion layer 115 and N⁻ drain layer 116).

13 Claims, 9 Drawing Sheets

SEMICONDUCTOR DEVICE

This application is based on Japanese patent application No. 2004-170536, the content of which is incorporated hereinto by reference.

BACKGROUND OF THE INVENTION

1. Field of the Invention

The present invention relates to a semiconductor device.

2. Related Art

In field effect transistors (FETs) such as a lateral power metal oxide semiconductor field effect transistor (MOSFET) having a source electrode on a back surface (a back surface source), a thickness of an effective epitaxial layer (hereinafter referred to as "effective epitaxial thickness") is considerably influential on a drain-source breakdown voltage (BVdss) and a drain-source capacitance (Cds), and it is preferable to have thicker effective epitaxial thickness to increase the drain-source breakdown voltage and reduce the drain-source capacitance.

Further, a diffusion of an impurity into a substrate is often conducted in order to contact the source with the back surface of the substrate, while an unwanted extending of the substrate is occurred by the diffusion of the impurity, thereby reducing the effective epitaxial thickness. The reason for contacting the source with the back surface of the substrate is that, when a wire is coupled thereto from a source electrode on the front surface side of the substrate, a source inductance generated by the wire considerably deteriorates the radio frequency (RF) characteristics, and under such circumstance, a source electrode is provided on the back surface thereof to provide a direct coupling of the back surface of the substrate to a package frame.

Accordingly, it is critical for inhibiting the extending of the substrate to provide a thicker effective epitaxial thickness, while diffusing an impurity into the substrate to provide a contact between the source and the back surface of the substrate. It is also critical to reduce a resistance of the substrate to the utmost.

In conventional techniques, which are typically represented by techniques described in Japanese Patent Laid-Open No. 2004-063,922 and Japanese Patent Laid-Open No. 2002-343,960, a field effect transistor (FET) such as an N-channel lateral MOSFET comprises a P⁻ epitaxial layer 11 on a P⁺ substrate 10, as shown in a cross-sectional view of FIG. 7, and a field effect transistor structure such as MOSFET and the like, which typically includes an N⁺ source diffusion layer 15, an N⁻ drain layer 16 and a gate electrode 17, are formed thereon. Here, the N⁺ source diffusion layer 15 is coupled to a P⁺ buried layer 12*a* through a source electrode 18. The P⁺ buried layer 12*a* is coupled to the P⁺ substrate 10 to form a back surface source-grounding structure.

The P⁺ buried layer 12*a* for forming the back surface source-grounding structure can be formed by, as shown in cross-sectional process views of FIGS. 8A to 8D, growing the P⁻ epitaxial layer 11 on the P⁺ substrate 10 (FIGS. 8A and 8B), and thereafter conducting a diffusion or an ion implantation of P⁺ for forming P⁺ buried layer 12*a* (FIG. 8C), and then thermally processing thereof for forming a buried structure (FIG. 8D).

SUMMARY OF THE INVENTION

However, it has now been discovered that the conventional techniques including the techniques disclosed in the above-described literature references still have a room for an improvement in the following point.

FIG. 7, FIGS. 8A to 8D and FIG. 9 include diagrams and a profile diagram for describing field effect transistors such as MOSFET in conventional technique. While boron is typically employed as a P-type impurity for the P⁺ substrate 10 and the P⁻ epitaxial layer 11 in FIG. 7 and FIGS. 8A to 8D, boron is a light element and thus has larger diffusion coefficient, and therefore provides larger extending on the substrate caused by the thermal processing of the substrate for the epitaxial growth or by the thermal processing of the substrate for the source diffusion.

For example, when boron of 10 Ωcm (about $1 \times 10^{15}$ cm$^{-3}$) is introduced into a P⁺ substrate containing boron of 0.0075 Ωcm (about $2 \times 10^{19}$ cm$^{-3}$) to form a P⁻ epitaxial layer having a thickness 10 μm and the formed P⁻ epitaxial layer is then thermally processed, an effective epitaxial thickness is on the order of about 3 μm, in the case of determining the effective epitaxial thickness at $2 \times 10^{15}$ cm$^{-3}$ as shown in FIG. 9 that presents a boron profile along A-A' direction in FIG. 7, due to causing a larger extending on the substrate, as indicated with an arrow in FIG. 9. Therefore, there is a room for an improvement in that it is difficult to increase the drain-source breakdown voltage (BVdss) and decrease the drain-source capacitance (Cds).

According to the present invention, there is provided a semiconductor device, comprising: a semiconductor substrate containing a first conductivity type impurity implanted in the semiconductor substrate; a second conductivity type impurity-implanted layer at relatively high concentration, formed on the semiconductor substrate; a second conductivity type impurity epitaxial layer at relatively low concentration, formed on the second conductivity type impurity-implanted layer; and a field effect transistor composed of a pair of impurity diffusion regions provided in the second conductivity type impurity epitaxial layer and a gate electrode provided over a region sandwiched with the pair of impurity diffusion regions.

According to the present invention, since the first conductivity type impurity contained in the semiconductor substrate and the second conductivity type impurity contained in the second conductivity type impurity-implanted layer attract each other by coulomb force, an extending of the semiconductor substrate can be prevented. Accordingly, an increase of the film thickness for the effective epitaxial thickness can be achieved, and thus a semiconductor device comprising a field effect transistor having larger drain-source breakdown voltage and smaller drain-source capacitance can be achieved.

The semiconductor device according to the present invention may further comprise a second conductivity type impurity source buried layer that contacts with the semiconductor substrate and with the second conductivity type impurity-implanted layer.

The semiconductor devices according to the present invention may further have a configuration, in which the first conductivity type impurity may include As or Sb. Resistance of the semiconductor substrate can be reduced by implanting As or Sb, which has comparatively smaller resistivity, as the first conductivity type impurity into the semiconductor substrate. Accordingly, the semiconductor device comprising the field effect transistor having the back surface source-grounding structure comprising the semiconductor substrate having lower resistance can be achieved. In addition, the extending of the semiconductor substrate can be further inhibited by forming the second conductivity type impurity-implanted layer on the semiconductor substrate implanted with As or Sb having comparatively smaller diffusion coefficient. Therefore, further increase in the film thickness for the effective epitaxial thickness can be achieved. As a result, the semiconductor device comprising the field effect transistor having higher drain-source breakdown voltage and lower drain-source capacitance can be achieved.

According to the present invention, the semiconductor device comprising the field effect transistor having high drain-source breakdown voltage and low drain-source capacitance is presented.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in further detail, in reference to the annexed figures. In all figures, identical numeral is assigned to an element commonly appeared in the figures, and the detailed description thereof will not be presented.

While the present embodiment is intended to describe, for example, an N-channel lateral MOSFET employing an N-type impurity as a first conductivity type impurity and employing a P-type impurity as a second conductivity type impurity, similar description can also be made for a P-channel lateral MOSFET, as taking the reversed conductivity types of the impurities.

Figure 1:
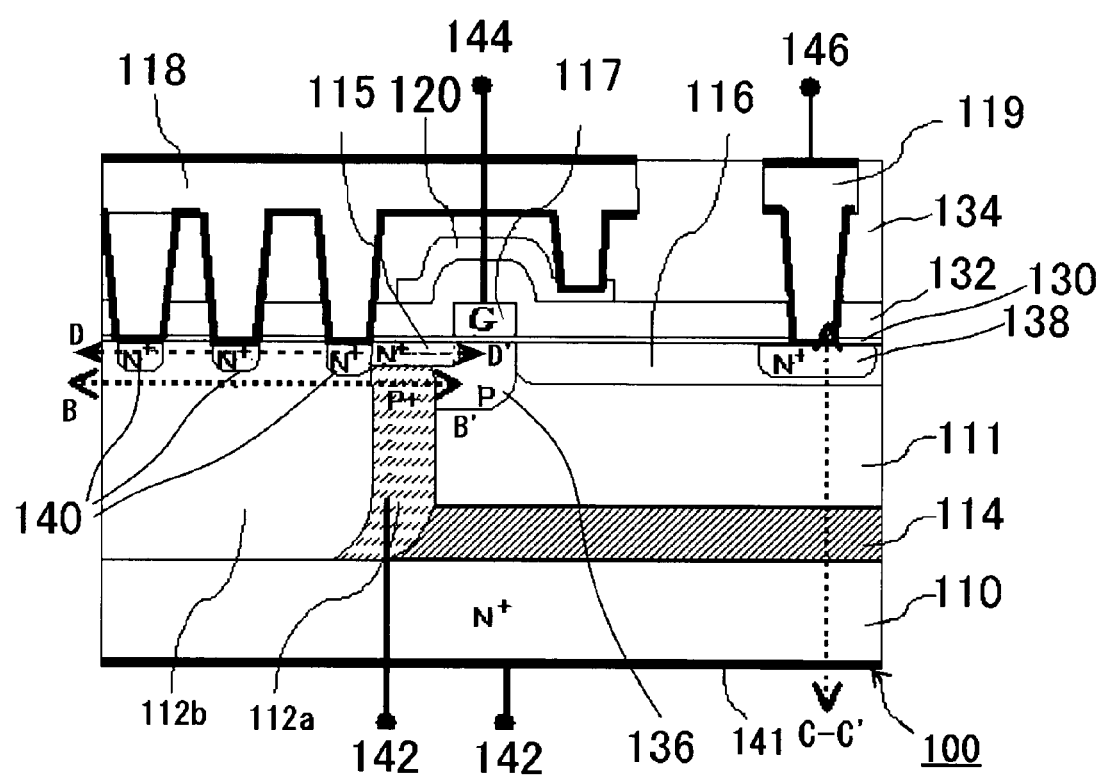
FIG. 1 is a schematic cross-sectional view of a MOSFET of an embodiment according to the present invention.

The semiconductor device shown in FIG. 1 comprises: a semiconductor substrate (N$^+$ substrate 110) containing a first conductivity type impurity implanted in the semiconductor substrate; a second conductivity type impurity-implanted layer (P$^+$ implanted layer 114) at relatively high concentration, formed on the semiconductor substrate (N$^+$ substrate 110); a second conductivity type impurity epitaxial layer (P$^-$ epitaxial layer 111) at relatively low concentration, formed on the second conductivity type impurity-implanted layer (P$^+$ implanted layer 114); and a field effect transistor (N-channel type lateral MOSFET 100) composed of a pair of impurity diffusion regions (N$^+$ source diffusion layer 115 and N$^-$ drain layer 116) provided in the second conductivity type impurity epitaxial layer (P$^-$ epitaxial layer 111) and a gate electrode 117 provided over a region sandwiched with the pair of impurity diffusion regions (N$^+$ source diffusion layer 115 and N$^-$ drain layer 116).

An N-channel type lateral MOSFET 100 according to the present embodiment is shown in FIG. 1.

The N-channel type lateral MOSFET 100 comprises a source electrode 118, a gate electrode 117 and a drain electrode 119. The N-channel type lateral MOSFET 100 comprises an N$^+$ substrate 110, which is a silicon substrate doped with an N-type impurity such as As, Sb, phosphorus and the like as a first conductivity type impurity, a P$^+$ implanted layer 114, which is a second conductivity type impurity-implanted layer at relatively high concentration, formed on the N$^+$ substrate 110 and containing a P-type impurity such as boron, Al and the like implanted therein, a P$^-$ epitaxial layer 111, which is a second conductivity type epitaxial layer at relatively low concentration, formed on the P$^+$ implanted layer 114 and containing a P-type impurity such as boron, Al and the like ion-implanted therein, a P$^+$ source buried layer 112$a$, which is a second conductivity type impurity source buried layer, formed on the N$^+$ substrate 110 and containing a P-type impurity such as boron, Al and the like ion-implanted therein, and an N$^+$ source buried layer 112$b$ containing an N-type impurity such as As, Sb, phosphor and the like ion-implanted therein.

In the present embodiment, the N$^+$ substrate 110 is implanted with, for example, As at a concentration of $2\times10^{19}$ cm$^{-3}$. In addition, the P$^+$ implanted layer 114 is implanted with, for example, boron at a concentration of $1\times10^{16}$ cm$^{-3}$, the P$^-$ epitaxial layer 111 is implanted with, for example, boron at a concentration of $1\times10^{15}$ cm$^{-3}$, and the concentration of impurity in the P$^+$ implanted layer 114 is relatively higher than the concentration in the P$^-$ epitaxial layer 111. Further, the P$^+$ source buried layer 112$a$ is implanted with, for example, boron at a concentration of $1\times10^{19}$ cm$^{-3}$.

In addition, an N$^-$ drain layer 116, which is a drain diffusion layer ion-implanted with an N-type impurity such as As, Sb, phosphorus and the like, a P$^+$ base layer 136 ion-implanted with a P-type impurity such as boron, Al and the like, and an N$^+$ contact 138 ion-implanted with an N-type impurity such as As, Sb, phosphorus and the like and coupled to the drain electrode 119 are formed in the P$^-$ epitaxial layer 111, and a gate electrode 117 is coupled to the P$^+$ base layer 136 through a gate insulating film 130. The circumference (top surface and side surface) of the gate electrode 117 except the portion of the gate electrode terminal 144 is covered with an insulating film 132. Moreover, an interlayer film 134 and a polysilicon electrode 120, which functions as inhibiting the electric field intensification to the gate electrode 117 and fixing the source reference potential, are formed on the insulating film 132. The drain electrode 119 comprises a drain electrode terminal 146 on the upper portion thereof.

In addition, a N$^+$ source diffusion layer 115, which is ion-implanted with a N-type impurity such as As, Sb, phosphorus and the like, is formed on the P+ source buried layer 112a, and is coupled to an N+ contact 140, which is formed in the N+ source buried layer 112b and is ion-implanted with an N-type impurity such as As, Sb, phosphorus and the like. The N+ contact 140 is coupled to the source electrode 118.

Here, the P+ implanted layer 114 is provided for the purpose of preventing a punch-through of the N− drain layer 116 and the N+ substrate 110, and the profile of the impurity is, for example, at a concentration on the order of $1 \times 10^{16}$ cm$^{-3}$ and the thickness thereof is on the order of 1 μm. Also, since the conductivity type of the impurity implanted into the N+ substrate 110 is opposite to the conductivity type of the impurity implanted into the P+ implanted layer 114, the extending of the N+ substrate 110 can be inhibited.

Figure 2:
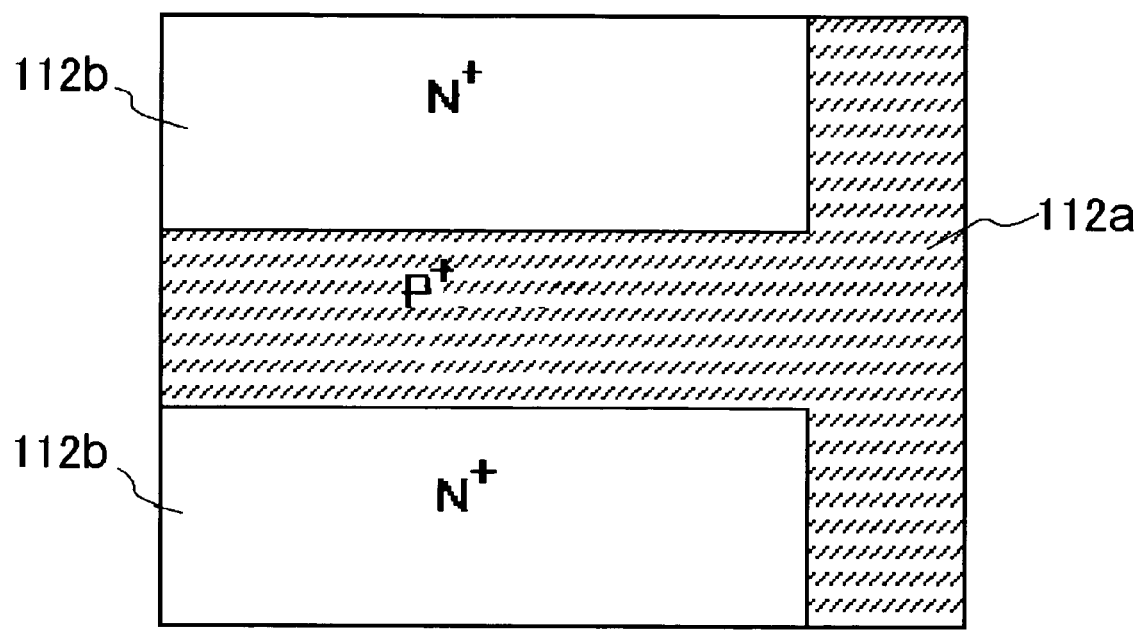
FIG. 2 is a plan view of B-B' face of MOSFET shown in FIG. 1 of the embodiment according to the present invention.

Here, the P+ implanted layer 114 is coupled to the P+ source buried layer 112a, and P+ source buried layer 112a is coupled to the source electrode 118 through the N+ contact 140 (the region where N-type impurity is implanted), by having a layout shown in FIG. 2, which is a plan view of a plane B-B' of FIG. 1, viewed from the upper direction.

Figure 3:
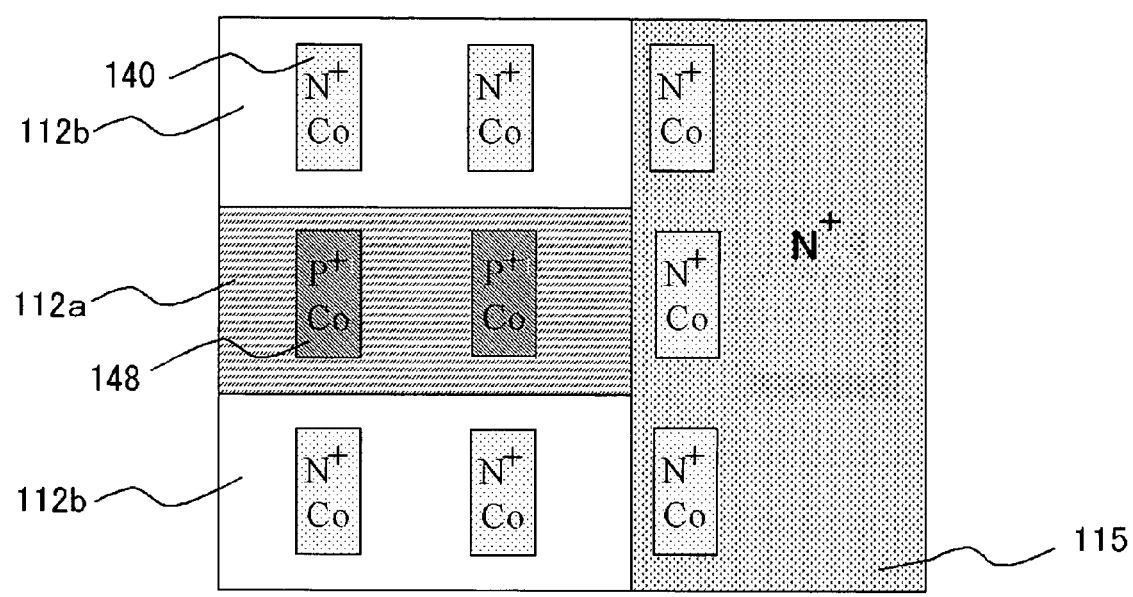
FIG. 3 is a plan view of D-D' surface of MOSFET of the embodiment according to the present invention.

In addition, as shown in FIG. 3, which is a plan view of a plane D-D' that is a contact portion shown in FIG. 1 viewed from the upper direction, the P+ source buried layer 112a is coupled to the source electrode 118 by disposing a P+ contact 148 in a region of the P+ source buried layer 112a except the region of the N+ source diffusion layer 115. The source electrode 118 is coupled to the N+ source buried layer 112b through the N+ contact 140. In addition, since the N+ source buried layer 112b is coupled to a back surface source electrode 141 (another source electrode), which is provided so as to cover the entire back surface of the N+ substrate 110 and comprises a back surface source terminal 142 in the lower portion thereof, the P+ source buried layer 112a is eventually grounded (coupled) to the back surface source electrode 141.

Therefore, since a source-grounding (source-coupling) is formed with the same P-type impurity on the back surface of the N+ substrate 110, as can be seen upon viewing the N+ substrate 110 from the side of the N-channel type lateral MOSFET, it works as a N-channel type lateral MOSFET.

A process for manufacturing the N-channel type lateral MOSFET 100 will be described as follows.

FIGS. 4A to 4F and FIGS. 5G to 5J are cross-sectional views illustrating the process for manufacturing the N-channel type lateral MOSFET 100.

Figure 4A:
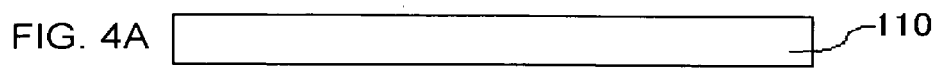
FIGS. 4A to 4F are cross-sectional views of a layer structure, schematically showing a manufacturing process for the MOSFET of the embodiment according to the present invention.
Figure 4B:
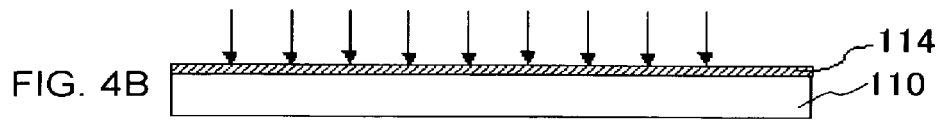
Figure 4C:
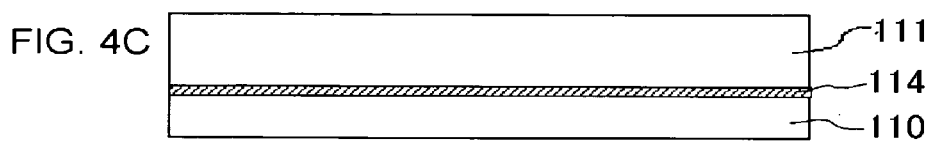

The P+ implanted layer 114 is formed by ion-implanting a P-type impurity such as boron and the like, or ion-diffusing a P-type impurity such as boron and the like implanted therein onto the N+ substrate 110 having an N-type impurity such as As, Sb, phosphorus and the like (FIGS. 4A and 4B). Then, a P− epitaxial growth is conducted by employing a P-type impurity ion such as boron and the like to form the P− epitaxial layer 111 (FIG. 4C).

Figure 4D:
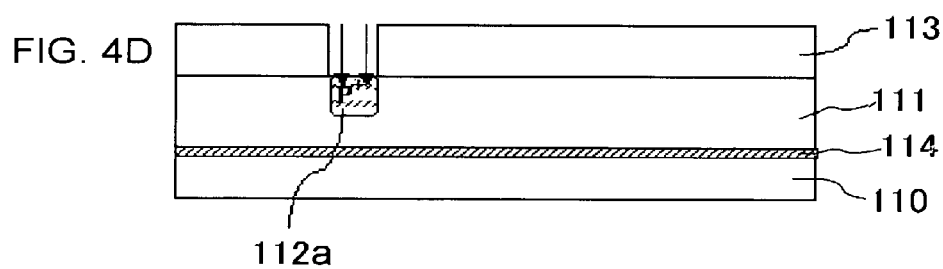

Subsequently, a resist 113 is formed on the P− epitaxial layer 111, and a P-type impurity such as boron is selectively diffused for the purpose of forming the P+ source buried layer 112a by employing a known lithography technique (FIG. 4D). Alternatively, an ion-implantation with a P-type impurity such as boron and the like may be conducted.

Figure 4E:
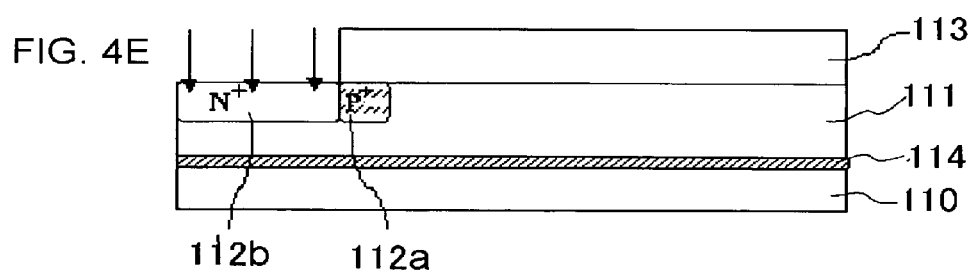
Figure 4F:
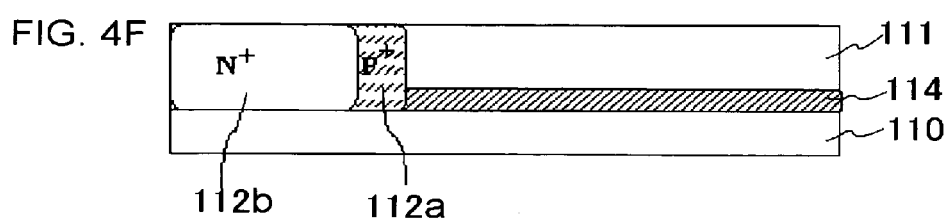

Next, an N-type impurity such as As, Sb, phosphorus and the like is selectively ion-diffused by using a known lithography technique to form an N+ source buried layer 112b (FIG. 4E). Alternatively, the N-type impurity may be ion-implanted. Then, a thermal processing is carried out for 5 to 6 hours at a temperature on the order of 1,150 degree C. to bury the P-type impurity and the N-type impurity in the P+ source buried layer 112a and the N+ source buried layer 112b (FIG. 4F).

Figure 5G:
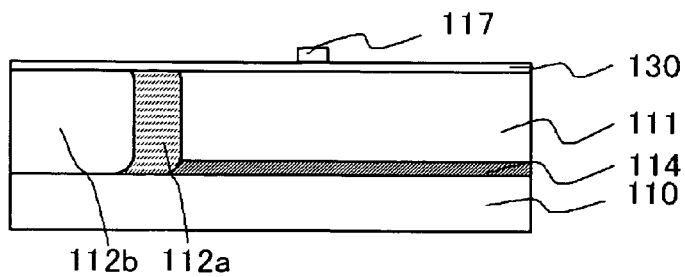
FIGS. 5G to 5J are cross-sectional views of a layer structure, schematically showing a manufacturing process for the MOSFET of the embodiment according to the present invention.
Figure 5H:
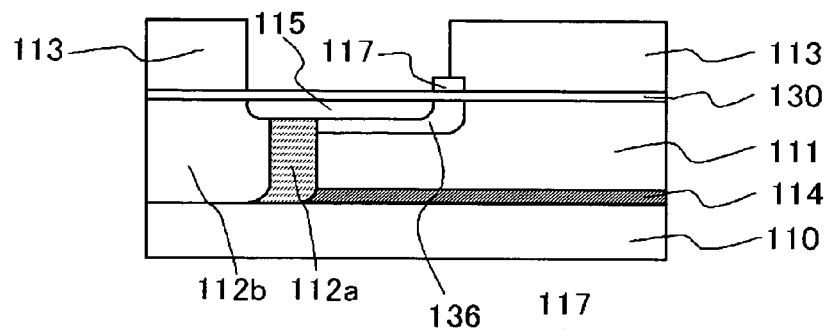
Figure 5I:
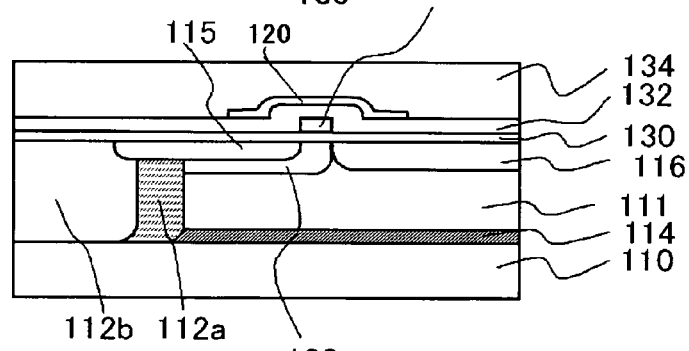

Then, a gate insulating film 130 is deposited thereon, and a multi-layered body of polysilicon and tungsten silicon and the like is formed on a portion thereof to provide a gate electrode 117 (FIG. 5G). Subsequently, a resist film 113 is formed thereon, and the formed resist film 113 is selectively stripped by employing a known lithography technique, and thereafter, a P-type impurity such as boron and the like is implanted into the gate electrode 117 and the P+ base layer 136, and subsequently, an N-type impurity such as As, Sb, phosphorus and the like is implanted into a source region (FIG. 5H). Then, an insulating film 132 for protecting the gate electrode 117 is formed, and a polysilicon electrode 120 and an interlayer film 134 are formed thereon, and after that, the interlayer film 134 is planarized using a chemical mechanical polishing (CMP) technique (FIG. 5I).

Figure 5J:
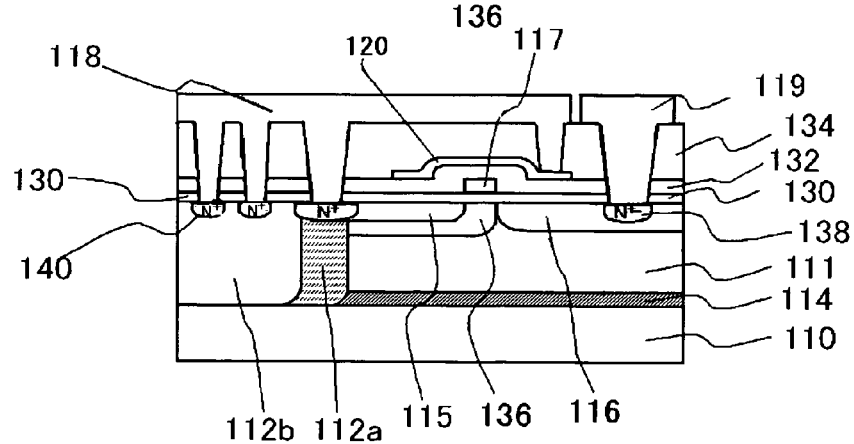

Then, a resist film (not shown in the drawings) is deposited on the interlayer film 134, and after selectively stripping the resist film (not shown in the drawings) using a known lithography technique, a contact hole is formed using a plasma etching technique and the like. Subsequently, an N-type impurity such as As, Sb, phosphorus and the like is ion-implanted into the bottom of the contact hole to form an N+ contact 138 and N+ contact 140. Subsequently, a barrier metal is deposited in the contact hole, and tungsten is grown up thereon, and then, an etch back process is carried out. Then, aluminum or the like is deposited using a sputtering technique, and thereafter, a source electrode 118 and a drain electrode 119 are formed using a known lithography technique and an etching technique (FIG. 5J). Then, a gate electrode terminal 144, a back surface source electrode 141, a back surface source terminal 142 and a drain electrode terminal 146 are provided to form the N-channel type lateral MOSFET 100 (FIG. 1).

Here, the N-channel type lateral MOSFET 100 is completed by the above-mentioned processes.

Advantageous effects of the N-channel type lateral MOSFET 100 according to the present embodiment will be described as follows.

In the present embodiment, the N-type impurity such as As, Sb, phosphorus and the like is introduced into the N+ substrate 110 to cause an attraction by coulomb force between atoms such as boron, Al and the like contained in the P+ implanted layer 114 and atoms such as As, Sb, phosphorus and the like contained in the N+ substrate 110 at the occasion of conducting the thermal processing for the P+ source buried layer 112a or the like, thereby providing an inhibition of the extending of the N+ substrate 110. Thus, the effective epitaxial thickness thereof can be increased. Therefore, the N-channel type lateral MOSFET 100 having larger drain-source breakdown voltage (BVdss) and reduced drain-source capacitance (Cds) can be presented.

In addition, concerning the substrate implanted with boron, which is typically employed in the conventional technique represented by the technique described in Japanese Patent Laid-Open No. 2004-063,922, it is difficult to increase the concentration of the implanted impurity such as boron for the purpose of maintaining the manufacturing stability Therefore, it is difficult to reduce the resistivity of the substrate, and the value of the resistivity is, for example, on the order of 0.005 Ωcm to 0.01 Ωcm. On the contrary, in the N-channel type lateral MOSFET 100, the resistivity of the N+ substrate 110 can be reduced by implanting As and Sb, which are N-type impurities that is capable of being implanted into the N+ substrate 110 at relatively higher concentration and has relatively lower resistivity. More specifically, the resistivity of the N⁺ substrate 110 can be on the order of 0.001 Ωcm to 0.003 Ωcm, which is a level equal to or less than one third of that of conventional substrate. Therefore, the N-channel type lateral MOSFET 100 having the back surface source-grounding structure and lower substrate resistance can be achieved.

Figure 6:
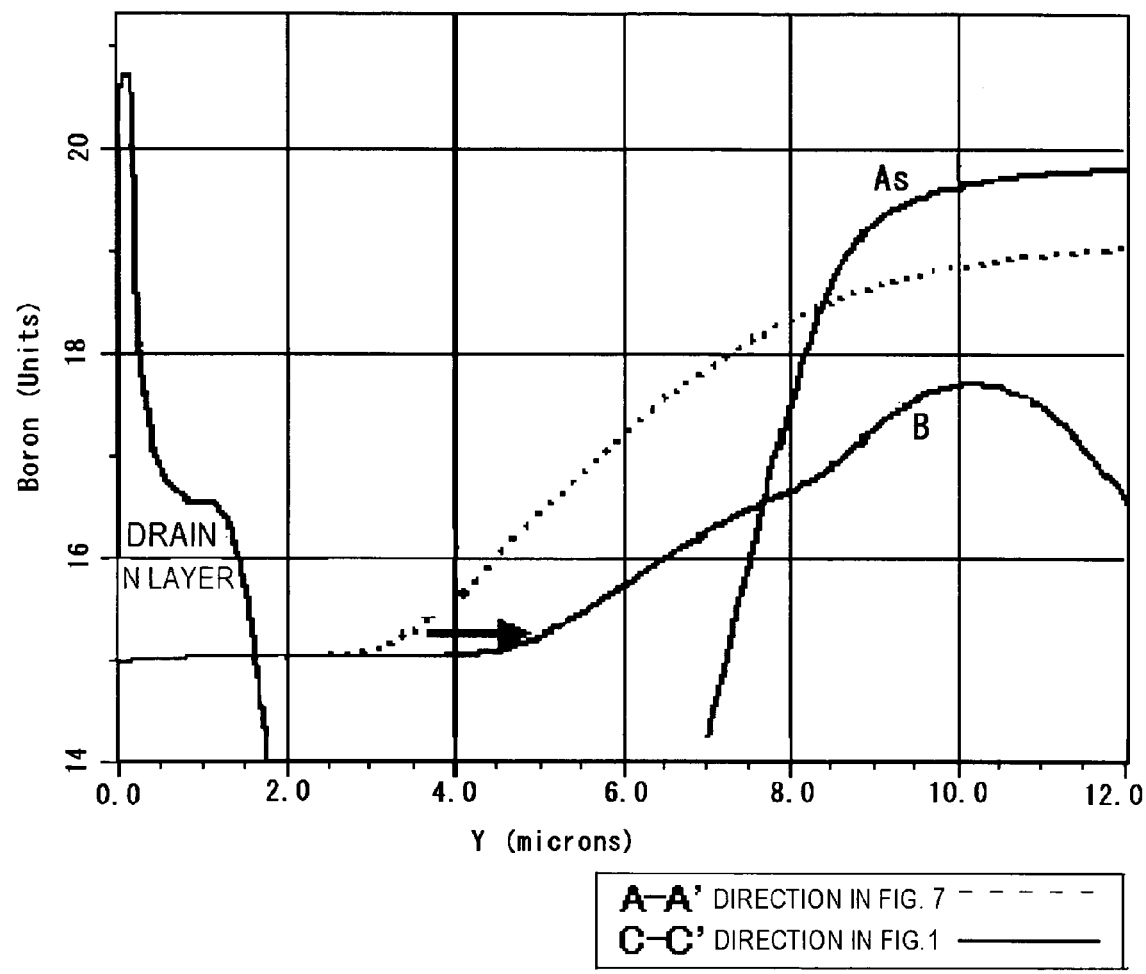
FIG. 6 is a diagram, showing an impurity profile of the MOSFET of the embodiment according to the present invention and an impurity profile of the MOSFET shown in FIG. 7.
Figure 7:
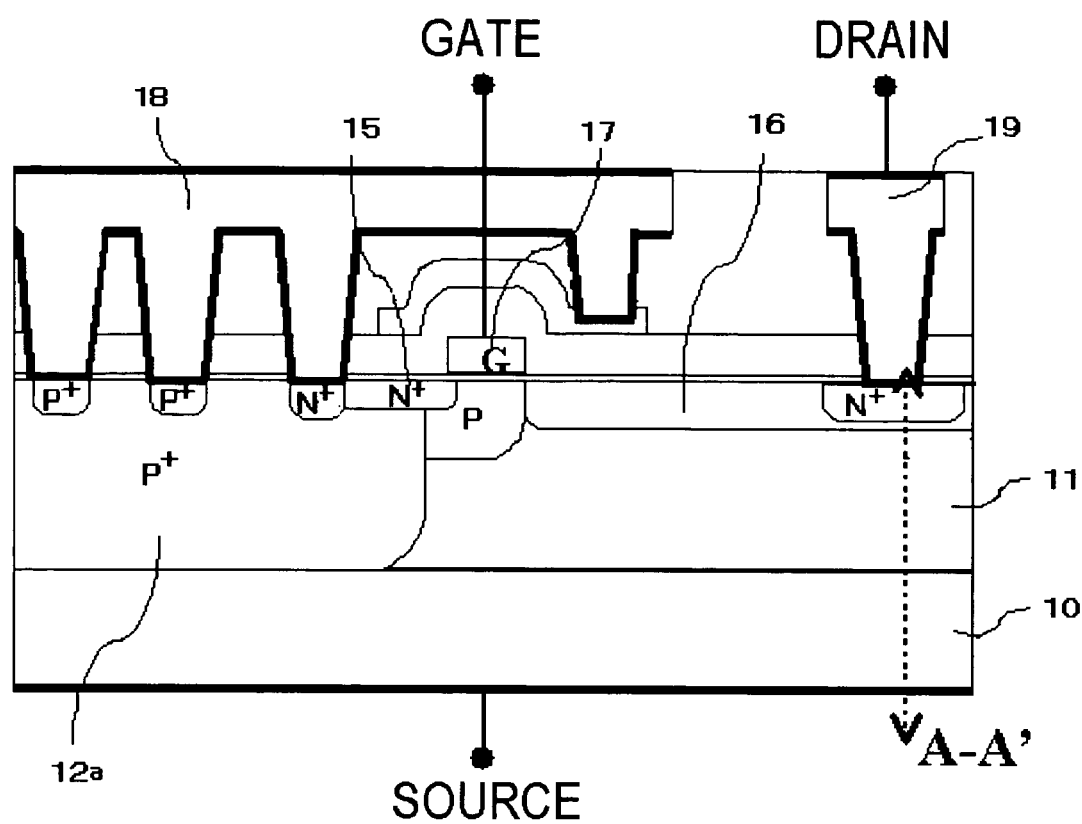
FIG. 7 is a schematic cross-sectional view of a MOSFET of a conventional technique.
Figure 8A:
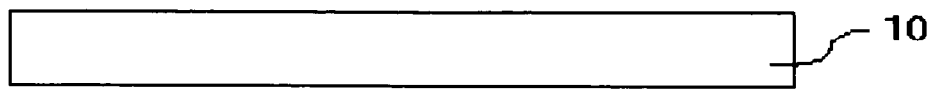
FIGS. 8A to 8D are cross-sectional views of a layer structure, schematically showing a manufacturing process for the MOSFET of a conventional technique.
Figure 8B:
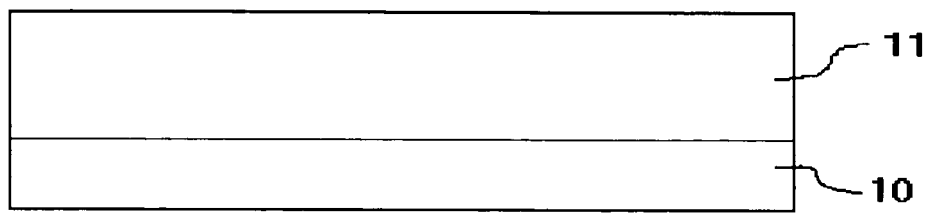
Figure 8C:
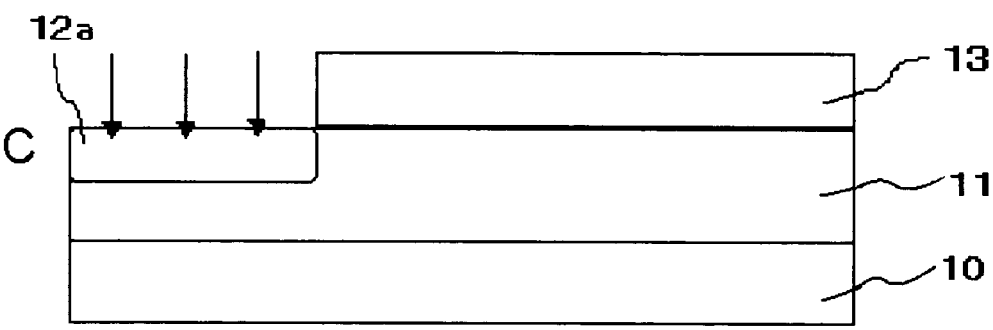
Figure 8D:
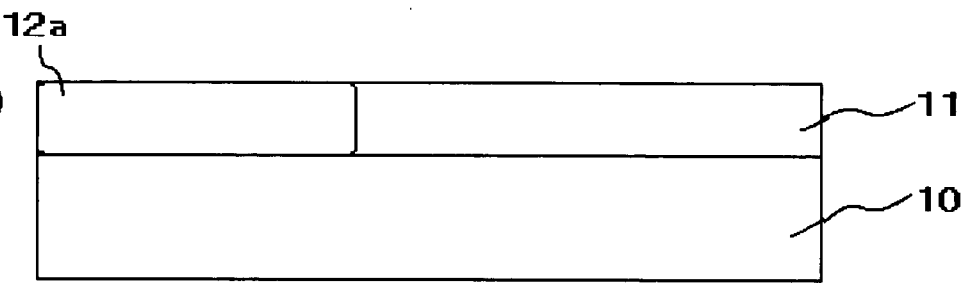
Figure 9:
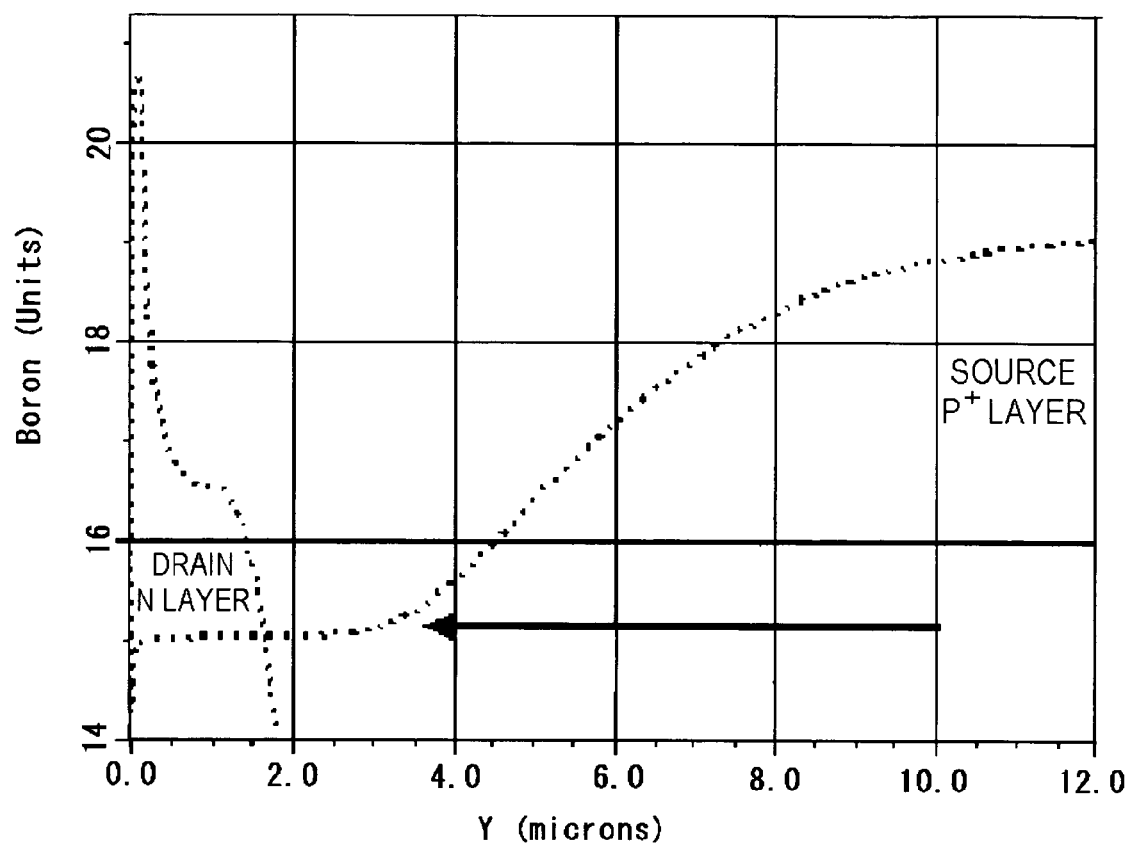
FIG. 9 is a diagram, showing an impurity profile of the MOSFET of a conventional technique.

Further, As and Sb, which have smaller diffusion coefficient as compared with boron that is used for being implanted into the substrate in the conventional technique, is implanted into the N⁺ substrate 110 in the present embodiment. For example, when the P⁺ implanted layer 114 and the P epitaxial layer 111 containing a P-type impurity such as boron implanted therein at 10 Ωcm (about $1\times10^{15}$ cm$^{-3}$) are formed to a thickness of 10 μm on the N⁺ substrate 110 containing As implanted therein at 0.0015 Ωcm (about $8\times10^{19}$ cm$^{-3}$), an effective epitaxial thickness thereof is about 5 μm, as shown in FIG. 6, which illustrates a profile along the direction in the line C-C' of the N-channel type lateral MOSFET 100 of FIG. 1. Thus, an extending of the N⁺ substrate 110 is smaller as shown by an arrow in FIG. 6, as compared with the effective epitaxial thickness of about 3 μm (FIG. 9), which is the effective epitaxial thickness provided by the conventional technique using boron, and therefore an increase in the film thickness of the effective epitaxial thickness by about 2 μm can be achieved. Therefore, the drain-source breakdown voltage can be improved by, for example, about 50V, as compared with the conventional technique, by increasing the film thickness of the effective epitaxial thickness by about 2 μm. The reason is that the drain-source breakdown voltage (BVdss) of the lateral MOSFET strongly depends on the effective epitaxial thickness, and in other words, an electric field intensification is occurred in a PN junction between the N⁻ drain layer 116 and the P⁻ epitaxial layer 111, thereby resulting in a yielding of the breakdown voltage. Thicker P⁻ epitaxial layer 111 provides more relaxation of such electric field intensification, since the depletion layer, which is a region with less amount of conduction electron, tends to be extended in the case of being applied with a voltage. Therefore, in the present embodiment, the N-channel type lateral MOSFET 100 having larger drain-source breakdown voltage (BVdss) can be achieved by being larger effective epitaxial thickness. Further, the drain-source capacitance (Cds) can be reduced by, for example, about 30% as compared with the conventional technique employing boron, by increasing the film thickness of the effective epitaxial thickness by about 2 μm as compared with the film thickness of the effective epitaxial thickness of the conventional technique employing boron. This is because the drain-source capacity is considerably affected by the PN junction capacity between the N⁻ drain layer 116 and the P⁻ epitaxial layer 111. Thus, thicker P⁻ epitaxial layer 111 provides further tendency of extending the depletion layer, which is a region with less amount of conduction electron, in the case of being applied with a voltage. Therefore, since PN junction capacity is reduced, further reduction of the drain-source capacitance (Cds) can be presented. As a result, the N-channel type lateral MOSFET 100 having further reduced drain-source capacitance (Cds) can be achieved.

While the embodiments of the present invention have been described above in reference to the annexed figures, it should be understood that the descriptions above are presented for the purpose of illustrating the present invention, and various configurations other than the above-described configurations can also be adopted.

For example, while the configuration for achieving the improvement in the drain-source breakdown voltage (BVdss) and the reduction of the drain-source capacitance (Cds) by employing the N-type impurity as the first conductivity type impurity and by employing the P-type impurity as the second conductivity type impurity has been described in the above-described embodiments, the P-type impurity may be employed as the first conductivity type impurity and the N-type impurity may be employed as the second conductivity type impurity. More specifically, the N-channel type lateral MOSFET 100 having increased drain-source breakdown voltage (BVdss) and reduced drain-source capacitance (Cds) presented by the inhibition of the extending of the N⁺ substrate 110 by coulomb force by forming the P⁺ implanted layer 114 on the N⁺ substrate 110 has been described in the above-described embodiments. Alternatively, an N⁺ implanted layer containing an N-type impurity such as phosphorus, As, Sb and the like implanted therein may be formed on a P⁺ substrate containing boron, Al and the like implanted therein. Having such configuration, the increase in the effective epitaxial thickness can be achieved by inhibiting the extending of the P⁺ substrate by coulomb force, and thus the P channel type lateral MOSFET having higher drain-source breakdown voltage (BVdss) and reduced drain-source capacitance (Cds) can be achieved.

Further, while the above-described embodiments describe on the metal oxide semiconductor field effect transistor (MOSFET), other types of the field effect transistor such as a metal insulator semiconductor field effect transistor (MISFET) may also be employed provided that: the first conductivity type impurity is used for the substrate, and an increase in the effective epitaxial thickness is achieved by inhibiting an extending of the substrate by providing a mutual attraction by coulomb force between the first conductivity type impurity contained in the substrate and the second conductivity type impurity contained in the second conductivity type impurity-implanted layer, thereby achieving a field effect transistor having an increased drain-source breakdown voltage (BVdss) and a reduced drain-source capacitance (Cds). Further, another alternative approach is to achieve a field effect transistor having a back surface source-grounding structure comprising the substrate having reduced resistance, by introducing one or two material(s) selected from a group consisting of As and Sb, which have relatively lower resistivity, into the substrate as the first conductivity type impurity to reduce the resistance of the substrate. In addition, further alternative approach is to achieve a field effect transistor having larger drain-source breakdown voltage and smaller drain-source capacitance by forming the second conductivity type impurity-implanted layer on the substrate containing As and Sb implanted therein, which are elements having smaller diffusion coefficient, to further inhibit the extending of the substrate, thereby achieving further increase in the effective epitaxial thickness.

While the preferred embodiments of the present invention have been described above, it should be understood that the configuration of the present invention is not limited to the above-described embodiments. For example, the present invention may include the following aspects.

(i) A field effect transistor having a source electrode, a gate electrode and a drain electrode, comprising: a substrate containing a first conductivity type impurity implanted in the substrate; a second conductivity type impurity-implanted layer at relatively higher concentration formed on the substrate; and a second conductivity type impurity epitaxial layer at relatively lower concentration formed on the second conductivity type impurity-implanted layer.

(ii) In the field effect transistor, further comprising a second conductivity type impurity source buried layer that contacts with the substrate and the second conductivity type impurity-implanted layer.

(iii) In the field effect transistor, wherein the first conductivity type impurity is one or two material(s) selected from a group consisting of As and Sb.

It is apparent that the present invention is not limited to the above embodiment, that may be modified and changed without departing from the scope and spirit of the invention.

What is claimed is:

1. A semiconductor device, comprising:
    a semiconductor substrate containing a first conductivity type impurity implanted in said semiconductor substrate;
    a second conductivity type impurity-implanted layer at a relatively high concentration, formed on said semiconductor substrate;
    a second conductivity type impurity epitaxial layer at a relatively low concentration, formed on said second conductivity type impurity-implanted layer; and
    a field effect transistor comprising:
        a pair of impurity diffusion regions provided in said second conductivity type impurity epitaxial layer; and
        a gate electrode provided over a region disposed between said pair of impurity diffusion regions; and
    a second conductivity type impurity source buried layer that contacts with said semiconductor substrate and with said second conductivity type impurity-implanted layer.

2. The semiconductor device according to claim 1, wherein said first conductivity type impurity includes As or Sb.

3. The semiconductor device according to claim 1, wherein an insulating film is provided to cover an upper face and a side face of said gate electrode, and a polysilicon electrode is provided to contact with an upper face of said insulating film.

4. The semiconductor device according to claim 1, wherein a source electrode is provided on an upper portion of said impurity diffusion region, another source electrode, which is different from said source electrode, is provided on a back surface of said semiconductor substrate, and said second conductivity type impurity source buried layer is coupled to said another source electrode.

5. The semiconductor device according to claim 4, wherein said another source electrode is provided to cover an entire back surface of said semiconductor substrate.

6. The semiconductor device according to claim 4, wherein a region implanted with a first conductivity type impurity is provided to contact with a lower surface of said source electrode, and said second conductivity type impurity source buried layer contacts with said source electrode.

7. The semiconductor device according to claim 1, wherein a concentration of said second conductivity type impurity epitaxial layer is lower than a concentration of said second conductivity type impurity-implanted layer.

8. The semiconductor device according to claim 1, wherein said first conductivity type impurity comprises boron or aluminum.

9. The semiconductor device according to claim 1, wherein said semiconductor substrate comprises an N-type substrate.

10. The semiconductor device according to claim 1, wherein said second conductivity type impurity-implanted layer comprises a P-type layer.

11. The semiconductor device according to claim 1, wherein a diffusion coefficient of said first conductivity type impurity is smaller than a diffusion coefficient of a second conductivity type impurity implanted in said second conductivity type impurity implanted layer.

12. The semiconductor device according to claim 7, wherein the concentration of said second conductivity type impurity-implanted layer is $1 \times 10^{-16}$ cm$^{-3}$ or more.

13. The semiconductor device according to claim 7, wherein a thickness of said second conductivity type impurity-implanted layer is 1 μm or more.

* * * * *